US012574015B2

(12) United States Patent
Ozasa

(10) Patent No.: US 12,574,015 B2
(45) Date of Patent: Mar. 10, 2026

(54) MULTIPLEXER

(71) Applicant: Murata Manufacturing Co., Ltd.,
Nagaokakyo (JP)

(72) Inventor: Motoki Ozasa, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 141 days.

(21) Appl. No.: 18/644,171

(22) Filed: Apr. 24, 2024

(65) Prior Publication Data

US 2024/0380387 A1 Nov. 14, 2024

(30) Foreign Application Priority Data

May 10, 2023 (JP) .................................. 2023-078003

(51) Int. Cl.
| | |
|---|---|
| *H03H 9/64* | (2006.01) |
| *H03H 9/25* | (2006.01) |
| *H03H 9/60* | (2006.01) |
| *H03H 9/72* | (2006.01) |
| *H04B 1/00* | (2006.01) |

(52) U.S. Cl.
CPC ............ *H03H 9/6483* (2013.01); *H03H 9/25*
(2013.01); *H03H 9/605* (2013.01); *H03H*
*9/725* (2013.01); *H04B 1/0057* (2013.01)

(58) Field of Classification Search
CPC ...... H04B 1/0057; H03H 9/605; H03H 9/725;
H03H 9/25; H03H 9/6483
See application file for complete search history.

(56) References Cited

U.S. PATENT DOCUMENTS

| | | | | |
|---|---|---|---|---|
| 2010/0110940 | A1* | 5/2010 | Hara ...................... | H03H 9/725 |
| | | | | 333/133 |
| 2016/0218695 | A1 | 7/2016 | Nosaka | |
| 2019/0363698 | A1* | 11/2019 | Nosaka ................. | H03H 9/725 |
| 2021/0013871 | A1* | 1/2021 | Nosaka ................. | H03H 9/706 |
| 2021/0036687 | A1* | 2/2021 | Okude .................. | H03H 9/568 |

FOREIGN PATENT DOCUMENTS

JP 2016-136687 A 7/2016

* cited by examiner

*Primary Examiner* — Quan Tra
(74) *Attorney, Agent, or Firm* — Keating & Bennett, LLP

(57) ABSTRACT

A multiplexer includes a first filter with a first pass band, and
a second filter with a second pass band higher than the first
pass band. Acoustic wave resonators included in the second
filter include a first series-arm resonator on a series arm path
of the second filter, a second series-arm resonator connected
in parallel with the first series-arm resonator, and a parallel-
arm resonator on a parallel arm path connecting a connec-
tion point between the first and second series-arm resonators
to the ground. A series-arm resonator including the first and
second series-arm resonators has an anti-resonant frequency
lower than the second pass band and an anti-resonant
frequency higher than the second pass band. The parallel-
arm resonator has an anti-resonant frequency lower than a
lower frequency end of the second pass band.

20 Claims, 10 Drawing Sheets

FILTER 20  (120→100)

FILTER 10  (100→110)

MULTIPLEXER

CROSS REFERENCE TO RELATED APPLICATIONS

This application claims the benefit of priority to Japanese Patent Application No. 2023-078003 filed on May 10, 2023. The entire contents of this application are hereby incorporated herein by reference.

BACKGROUND OF THE INVENTION

1. Field of the Invention

The present invention relates to multiplexers each including an acoustic wave filter.

2. Description of the Related Art

In Japanese Unexamined Patent Application Publication No. 2016-136687, a ladder-type acoustic wave filter including two series-arm resonators that are connected in parallel and a parallel-arm resonator is disclosed. A resonator including the two series-arm resonators that are combined together has a first anti-resonant frequency that is lower than a pass band of the acoustic wave filter and a second anti-resonant frequency that is higher than the pass band. Thus, the band width of the acoustic wave filter can be reduced, and steepness of filter characteristics of the acoustic wave filter can be improved.

SUMMARY OF THE INVENTION

However, in the case where the acoustic wave filter disclosed in Japanese Unexamined Patent Application Publication No. 2016-136687 is used as a filter on a higher frequency side of a multiplexer, due to an inductive impedance obtained in a frequency band lower than the first anti-resonant frequency, ripple may be generated near a pass band of a filter on a lower frequency side.

Accordingly, example embodiments of the present invention provide multiplexers in each of which insertion loss in pass bands of filters connected in common are reduced.

A multiplexer according to an example embodiment of the present invention includes a first filter with a first pass band, and a second filter with a second pass band including higher frequencies than frequencies of the first pass band. A first end of the first filter and a first end of the second filter are connected. The second filter includes a plurality of acoustic wave resonators each including a first series-arm resonator on a series arm path connecting the first end to a second end of the second filter, a second series-arm resonator connected in parallel with the first series-arm resonator, and a first parallel-arm resonator on a parallel arm path connecting a connection point adjacent to the first end among connection points between the first series-arm resonator and the second series-arm resonator to a ground. A resonator including the first series-arm resonator and the second series-arm resonator that are combined together has a first anti-resonant frequency that is lower than the second pass band and a second anti-resonant frequency that is higher than the second pass band. The first parallel-arm resonator has a third anti-resonant frequency. The third anti-resonant frequency is lower than a lower frequency end of the second pass band.

According to example embodiments of the present invention, multiplexers in each of which insertion loss in pass bands of filters connected in common is reduced can be provided.

The above and other elements, features, steps, characteristics and advantages of the present invention will become more apparent from the following detailed description of the example embodiments with reference to the attached drawings.

Figure 1:
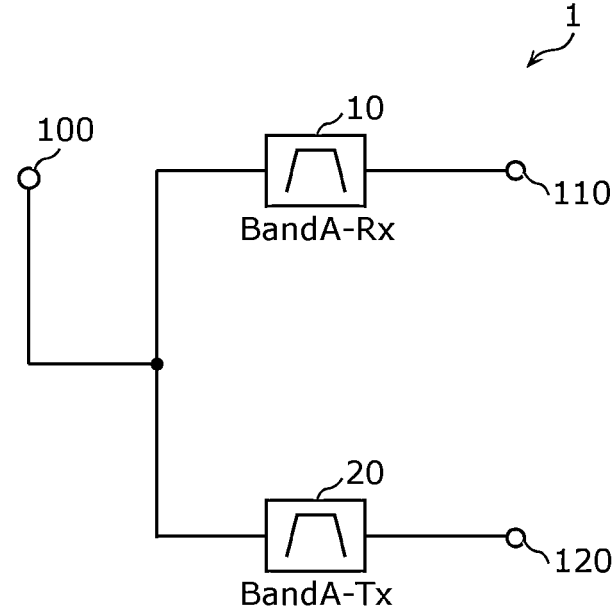
FIG. 1 is a circuit configuration diagram of a multiplexer according to an example embodiment of the present invention.

DETAILED DESCRIPTION OF THE EXAMPLE
EMBODIMENTS

Example embodiments of the present disclosure will be described in detail below with reference to drawings. The example embodiments described below each illustrate a comprehensive or specific example. The numerical values, shapes, materials, component elements, arrangements of the component elements, manners in which the component elements are connected, and so on illustrated in the example embodiments described below are merely examples and are not intended to limit the present invention. Among the component elements in the example embodiments described below, component elements that are not described in independent claims are described as arbitrary component elements. In addition, the sizes of or the size ratios between the component elements illustrated in the drawings are not necessarily precise.

The drawings are schematic diagrams in which emphasis, omission, or ratio adjustment is performed in an appropriate manner in order that example embodiments of the present invention are illustrated. The drawings are not necessarily illustrated strictly and may differ from actual shapes, positional relationships, and ratios. In the drawings, substantially the same configurations are denoted by the same reference signs, and repetitive description may be omitted or simplified.

In a circuit configuration in example embodiments of the present disclosure, "being connected" not only represents being directly connected by a connection terminal and/or a wiring conductor but also includes being electrically connected with matching elements such as an inductor and a capacitor and a switch circuit interposed therebetween. "Being connected between A and B" represents being connected between A and B and to both A and B.

Furthermore, terms, such as "parallel" and "perpendicular", representing the relationship between elements, terms, such as "rectangular", representing the shape of an element, and numerical ranges are not strict expressions but also represent substantially equivalent ranges, which include, for example, a difference of a few percent.

In example embodiments described below, a pass band of a filter is defined as a frequency band between two frequency points that are greater than the minimum value of insertion loss in the pass band by about 3 dB, for example.

Furthermore, in example embodiments of the present disclosure, band A represents a frequency band defined in advance by a standardization organization (for example, 3GPP (registered trademark), Institute of Electrical and Electronics Engineers (IEEE), etc.) for a communication system established using radio access technology (RAT). In an example embodiment, for example, a long term evolution (LTE) system, a 5th generation new radio (5G-NR) system, a wireless local area network (WLAN) system, or the like can be used as a communication system. However, the communication system is not limited to the systems described above.

Furthermore, an uplink operating band of band A represents a frequency range specified for uplink of band A. A downlink operating band of band A represents a frequency range specified for downlink of band A.

EXAMPLE EMBODIMENT 1.1 Circuit Configuration of Multiplexer 1

FIG. 1 is a circuit configuration diagram of a multiplexer 1 according to an example embodiment. As illustrated in FIG. 1, the multiplexer 1 includes filters 10 and 20, a common terminal 100, an output terminal 110, and an input terminal 120.

The common terminal 100 is, for example, connected to an antenna.

The filter 20 is an example of a first filter and has a pass band (first pass band) including an uplink-operating band of band A. A first end (output end) of the filter 20 is connected to the common terminal 100, and a second end (input end) is connected to the input terminal 120. The filter 10 may be, for example, an acoustic wave filter including an acoustic wave resonator or an LC filter including an inductor and a capacitor and is not limited to the filters mentioned above.

The filter 10 is an example of a second filter and has a pass band (second pass band) including a downlink operating band of band A. The pass band of the filter 10 is higher than the pass band of the filter 20. A first end (input end) of the filter 10 is connected to the common terminal 100, and a second end (output end) of the filter 10 is connected to the output terminal 110. That is, the first end of the filter 10 and the first end of the filter 20 are connected. The filter 10 is an acoustic wave filter including a plurality of acoustic wave resonators.

For example, LTE Band 30 (uplink operating band: 2305 MHz to 2315 MHz, downlink operating band: 2350 MHz to 2360 MHz) may be used as band A.

The pass band of the filter 10 only needs to be higher than the pass band of the filter 20. The pass bands of the filters 10 and 20 do no necessarily include a downlink-operating band and an uplink operating band of the same band. For example, the pass band of the filter 10 may include band B and the pass band of the filter 20 may include band C that is lower than band B.

In the multiplexer 1 according to the current example embodiment, filters different from the filters 10 and 20 may be connected to the common terminal 100. Furthermore, an impedance matching circuit including at least one of an inductor and a capacitor may be connected to any one of a path that connects the common terminal 100 to the output terminal 110 and a path that connects the common terminal 100 to the input terminal 120.

The multiplexer 1 does not necessarily include the common terminal 100, the output terminal 110, and the input terminal 120.

1.2 Circuit Configuration of Filter 10

Next, a circuit configuration of the filter 10 configuring the multiplexer 1 will be illustrated.

Figure 2:
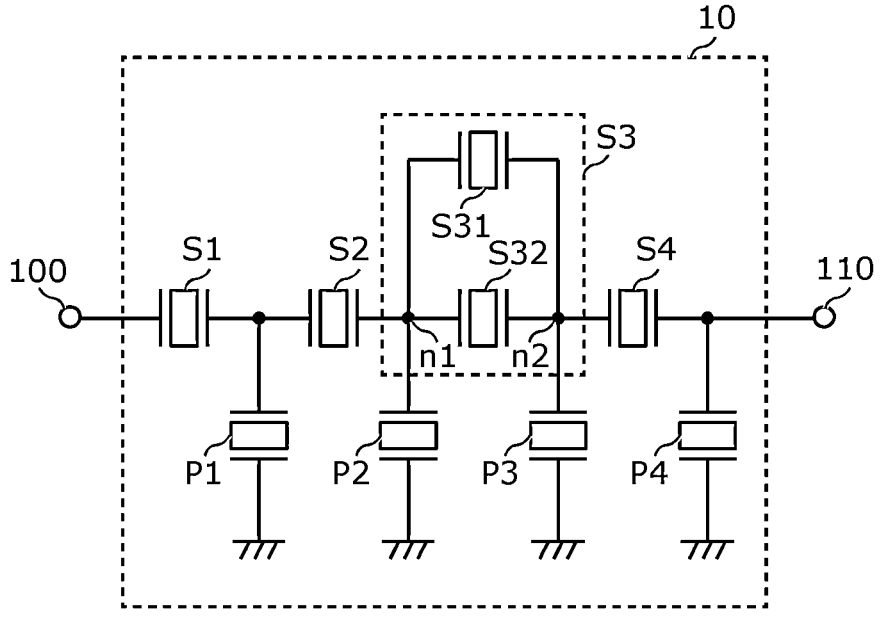
FIG. 2 is a circuit configuration diagram of an acoustic wave filter configuring a multiplexer according to an example embodiment of the present invention.

FIG. 2 is a circuit configuration diagram of the filter 10 (second filter) configuring the multiplexer 1 according to the current example embodiment. As illustrated in FIG. 2, the filter 10 includes series-arm resonators S1, S2, S3, and S4 and parallel-arm resonators P1, P2, P3, and P4.

The series-arm resonators S1 to S4 are disposed on a series arm path connecting the first end to the second end of the filter 10 (connecting the common terminal 100 to the output terminal 110). Furthermore, the parallel-arm resonators P1 to P4 are connected between connection points between the series-arm resonators S1 to S4 and the output terminal 110 and the ground. With the connection arrangement described above, the filter 10 is configured as a ladder band pass filter.

The series-arm resonator S3 includes series-arm resonators S31 and S32 that are connected in parallel. The series-arm resonator S31 is an example of a first series-arm resonator and is disposed on the series arm path. The series-arm resonator S32 is an example of a second series-arm resonator and is disposed on the series arm path. The series-arm resonator S32 is connected in parallel with the series-arm resonator S31.

The parallel-arm resonator P2 is an example of a first parallel-arm resonator and is disposed on a parallel arm path connecting a connection point n1 near the first end of the filter 10 (near the common terminal 100), out of connection points n1 and n2 between the series-arm resonator S31 and the series-arm resonator S32, to the ground.

The series-arm resonator S2 is an example of a third series-arm resonator and is disposed on a portion of the series arm path between the common terminal 100 and the series-arm resonator S3. The series-arm resonator S2 is a series-arm resonator that is connected closest to the series-arm resonator S3, out of the series-arm resonators S1 and S2.

In the filter 10 according to the current example embodiment, the series-arm resonator S3 and the parallel-arm resonator P2 are included component elements, and other series-arm resonators and parallel-arm resonators are not necessarily provided. Furthermore, in the filter 10, a longitudinally-coupled acoustic wave resonator may be connected to be closer to the output terminal 110 than the series-arm resonator S3 is or to be closer to the common terminal 100 than the parallel-arm resonator P2 is. Furthermore, an inductor may be connected between each of the parallel-arm resonators P1 to P4 and the ground.

1.3 Structure of Acoustic Wave Resonator

Next, a structure of an acoustic wave resonator included in the filter 10 will be illustrated.

Figure 3A:
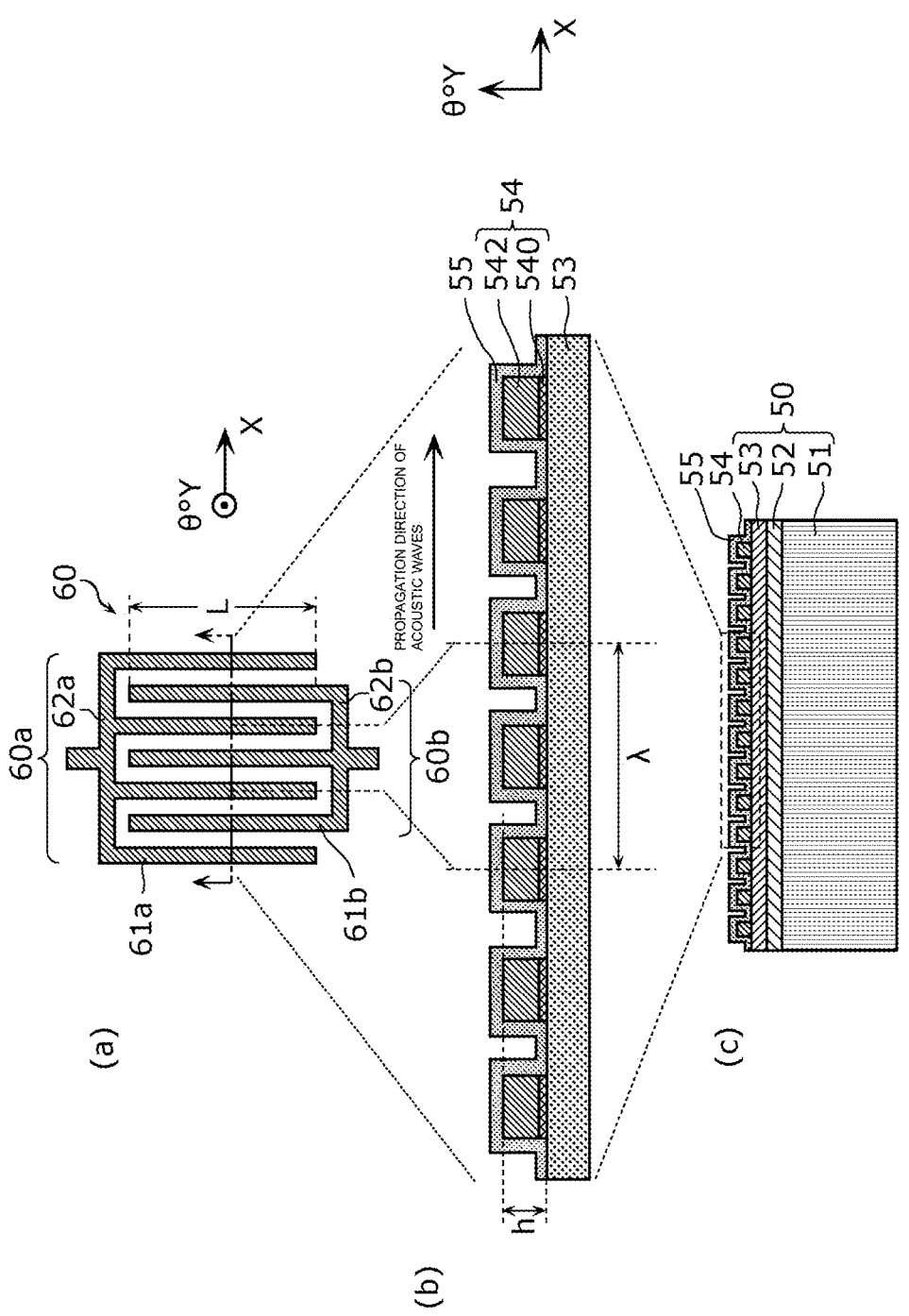
FIG. 3A includes a plan view and cross-section views schematically illustrating a first example of an acoustic wave resonator of a second filter in an example embodiment of the present invention.

FIG. 3A includes a plan view and cross-section views schematically illustrating a first example of an acoustic wave resonator of the filter 10 (second filter) in the current example embodiment. In FIG. 3A, a basic structure of each of the plurality of acoustic wave resonators (series-arm resonators S1, S2, S31, S32, and S4 and parallel-arm resonators P1, P2, P3, and P4) of the filter 10 is illustrated. An acoustic wave resonator 60 in FIG. 3A is illustrated to explain a typical structure of an acoustic wave resonator of the acoustic wave element 10. The number, length, and the like of electrode fingers configuring an electrode are not limited to the example illustrated in FIG. 3A.

The acoustic wave resonator 60 includes a substrate 50 with piezoelectricity and comb-shaped electrodes 60a and 60b.

As illustrated in (a) of FIG. 3A, the pair of comb-shaped electrodes 60a and 60b that are opposite to each other are provided on the substrate 50. The comb-shaped electrode 60a includes a plurality of electrode fingers 61a that are parallel to each other and a busbar electrode 62a that connects to the plurality of electrode fingers 61a. The comb-shaped electrode 60b includes a plurality of electrode fingers 61b that are parallel to each other and a busbar electrode 62b that connects the plurality of electrode fingers 61b. The plurality of electrode fingers 61a and 61b are provided along a direction orthogonal to a propagation direction of acoustic waves (X-axis direction).

Furthermore, an IDT electrode 54 including the plurality of electrode fingers 61a and 61b and the busbar electrodes 62a and 62b has a multilayer structure including a close-contact layer 540 and a main electrode layer 542, as illustrated in (b) of FIG. 3A.

The close-contact layer 540 is a layer provided to improve the characteristic of close contact between the substrate 50 and the main electrode layer 542, and the close-contact layer 540 is made of, for example, Ti. The main electrode layer 542 is made of, for example, Al including about 1% of Cu. A protection layer 55 covers the comb-shaped electrodes 60a and 60b. The protection layer 55 is a layer provided for the purpose of protecting the main electrode layer 542 from external environment, adjusting frequency-temperature characteristics, increasing moisture resistance, and the like. The protection layer 55 is, for example, a dielectric film including silicon dioxide as a main component.

Materials of the close-contact layer 540, the main electrode layer 542, an the protection layer 55 are not limited to materials mentioned above. Furthermore, the IDT electrode 54 does not necessarily have the multilayer structure described above. The IDT electrode 54 may be made of, for example, metal such as Ti, Al, Cu, Pt, Au, Ag, or Pd or an alloy of metals mentioned above or may be formed of a plurality of multilayer bodies made of metals or alloys of metals mentioned above. Furthermore, the protection layer 55 is not necessarily formed.

Next, a multilayer structure of the substrate 50 will be described.

As illustrated in (c) of FIG. 3A, the substrate 50 includes a high acoustic velocity support substrate 51, a low acoustic velocity film 52, and a piezoelectric film 53 and has a structure in which the high acoustic velocity support substrate 51, the low acoustic velocity film 52, and the piezoelectric film 53 are laminated in this order.

The piezoelectric film 53 is made of, for example, $\theta°$ Y-cut X-propagating $LiTaO_3$ piezoelectric single crystal or piezoelectric ceramics (lithium tantalate single crystal or ceramics that is cut along a plane whose normal is defined by an axis rotated by $\theta°$ from a Y-axis around an X-axis, surface acoustic waves propagating in the X-axis direction in the single crystal or ceramics). A material and cut-angle $\theta$ of piezoelectric single crystal used as the piezoelectric film 53 are selected in an appropriate manner according to specifications required for each filter.

The high acoustic velocity support substrate 51 is a substrate that supports the low acoustic velocity film 52, the piezoelectric film 53, and the IDT electrode 54. The high acoustic velocity support substrate 51 is a substrate in which bulk waves propagate at an acoustic velocity higher than an acoustic velocity of acoustic waves such as surface acoustic waves and boundary acoustic waves propagating in the piezoelectric film 53. The high acoustic velocity support substrate 51 functions to confine surface acoustic waves in a portion where the piezoelectric film 53 and the low acoustic velocity film 52 are laminated so that the surface acoustic waves do not leak below the high acoustic velocity support substrate 51. The high acoustic velocity support substrate 51 may be made of, for example, a piezoelectric material such as aluminum nitride, lithium tantalate, lithium niobate, or quartz, ceramic such as alumina, sapphire, magnesia, silicon nitride, silicon carbide, zirconia, cordierite, mullite, steatite, forsterite, spinel, or Sialon, a dielectric such as aluminum oxide, silicon oxynitride, DLC (diamond-like carbon), or diamond, a semiconductor such as silicon, or a material including a material mentioned above as a main component. The spinel mentioned above includes an aluminum compound including one or more elements selected from Mg, Fe, Zn, Mn, and the like and oxygen. The spinel mentioned above is, for example, $MgAl_2O_4$, $FeAl_2O_4$, $ZnAl_2O_4$, or $MnAl_2O_4$.

The low acoustic velocity film 52 is a film in which bulk waves propagate at an acoustic velocity lower than an acoustic velocity of bulk waves propagating in the piezoelectric film 53 and is disposed between the piezoelectric film 53 and the high acoustic velocity support substrate 51. With this structure and characteristics of acoustic waves whose energy is intrinsically concentrated on a medium with low acoustic velocity, leakage of surface acoustic wave energy to the outside of the IDT electrode can be reduced or prevented. The low acoustic velocity film 52 may be made of, for example, a dielectric such as glass, silicon oxide, silicon oxynitride, lithium oxide, tantalum oxide, a compound obtained by adding fluorine, carbon, or boron to silicon oxide, or a material including a material mentioned above as a main component.

With the multilayer structure of the substrate 50 described above, a Q value at a resonant frequency and an anti-resonant frequency can be significantly increased compared to a conventional structure including a piezoelectric substrate as a single layer. That is, since an acoustic wave resonator with a high Q value can be configured, a filter with low insertion loss including such an acoustic wave resonator can be configured.

The high acoustic velocity support substrate 51 may have a structure in which a support substrate and a high acoustic velocity film in which bulk waves propagate at an acoustic velocity higher than an acoustic velocity of acoustic waves such as surface acoustic waves and boundary acoustic waves propagating in the piezoelectric film 53 are laminated. In this case, the same material as the material of the high acoustic velocity support substrate 51 may be used as the material of the high acoustic velocity film. Furthermore, the support substrate may be made of, for example, a piezoelectric material such as aluminum nitride, lithium tantalate, lithium niobate, or quartz, ceramic such as alumina, sapphire, magnesia, silicon nitride, silicon carbide, zirconia, cordierite, mullite, steatite, or forsterite, a dielectric such as diamond or glass, a semiconductor such as silicon or gallium nitride, resin, or a material including a material mentioned above as a main component.

Herein, "a main component of a material" represents a component having a proportion exceeding about 50% by weight in the material. The main component mentioned above may exist in the state of single crystal, polycrystal, or amorphous or the state of mixture of some of the states mentioned above.

Figure 3B:
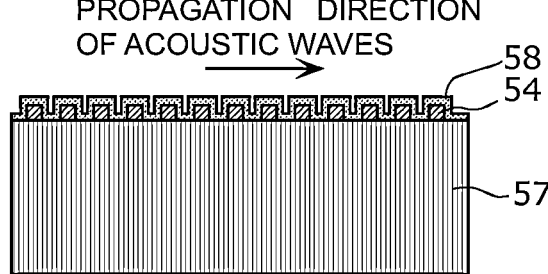
FIG. 3B is a cross-section view schematically illustrating a second example of the acoustic wave resonator of the second filter in an example embodiment of the present invention.

FIG. 3B is a cross-section view schematically illustrating a second example of the acoustic wave resonator of the filter 10 according to the current example embodiment. As the acoustic wave resonator 60 illustrated in FIG. 3A, an example in which the IDT electrode 54 is provided on the substrate 50 including the piezoelectric film 53 is illustrated. However, as illustrated in FIG. 3B, a substrate on which the IDT electrode 54 is provided may be a piezoelectric single crystal substrate 57 including a single piezoelectric layer.

The piezoelectric single crystal substrate 57 is made of, for example, $LiNbO_3$ piezoelectric single crystal. The acoustic wave resonator in this example includes the piezoelectric single crystal substrate 57 made of $LiNbO_3$, the IDT electrode 54, and a protection layer 58 provided on the piezoelectric single crystal substrate 57 and the IDT electrode 54.

The multilayer structures, materials, cut-angles, and thicknesses of the piezoelectric film 53 and the piezoelectric single crystal substrate 57 described above may be changed according to bandpass characteristics required for an acoustic wave filter device. An acoustic wave resonator including an $LiTaO_3$ piezoelectric substrate having a cut-angle different from the cut-angle mentioned above can also achieve effects similar to those achieved by the acoustic wave resonator 60 including the piezoelectric film 53 described above.

Furthermore, a substrate at which the IDT electrode 54 is provided may have a structure in which a support substrate, an energy confinement layer, and a piezoelectric film are laminated in this order. The IDT electrode 54 is provided on the piezoelectric film. The piezoelectric film is made of, for example, $LiTaO_3$ piezoelectric single crystal or piezoelectric ceramics. The support substrate is a substrate that supports the piezoelectric film, the energy confinement layer, and the IDT electrode 54.

The energy confinement layer includes one or multiple layers. The velocity of bulk acoustic waves propagating in at least one layer of the energy confinement layer is higher than the velocity of acoustic waves propagating near the piezoelectric film. For example, the energy confinement layer may have a multiplayer structure including a low acoustic velocity layer and a high acoustic velocity layer. The low acoustic velocity layer is a film in which an acoustic velocity of bulk waves is lower than an acoustic velocity of acoustic waves propagating in the piezoelectric film. The high acoustic velocity layer is a film in which bulk waves propagate at an acoustic velocity higher than an acoustic velocity of acoustic waves propagating in the piezoelectric film. The support substrate may be a high acoustic velocity layer.

Furthermore, the energy confinement layer may be an acoustic impedance layer having a configuration in which low acoustic impedance layers with a relatively low acoustic impedance and high acoustic impedance layers with a relatively high acoustic impedance are laminated alternately.

Electrode parameters of an IDT electrode configuring the acoustic wave resonator 60 will now be described.

The wavelength of an acoustic wave resonator is defined by a wavelength λ, which is a repetition period of the plurality of electrode fingers 61a or 61b configuring the IDT electrode 54 illustrated in (b) of FIG. 3A. Furthermore, an electrode finger pitch is equal to half the wavelength λ and is defined by (W+S), where the line width of the electrode fingers 61a and 61b configuring the comb-shaped electrodes 60a and 60b, respectively, is represented by W and the space width between an electrode finger 61a and an electrode finger 61b that are adjacent to each other is represented by S.

In the case where the gap between electrode fingers that are adjacent to each other in the IDT electrode 54 is not fixed, the electrode finger pitch of the IDT electrode 54 is defined by an average electrode finger pitch of the IDT electrode 54. The average electrode finger pitch of the IDT electrode 54 is defined by Di/(Ni−1), where the total number of the electrode fingers 61a and 61b included in the IDT electrode 54 is represented by Ni and the distance between the center of an electrode finger located at one end of the IDT electrode 54 in the propagation direction of acoustic waves and the center of an electrode finger located at the other end of the IDT electrode 54 in the propagation direction of acoustic waves is represented by Di.

Figure 3C:
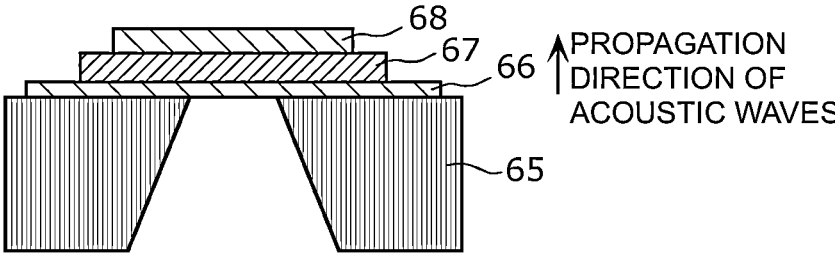
FIG. 3C is a cross-section view schematically illustrating a third example of the acoustic wave resonator of the second filter in an example embodiment of the present invention.

FIG. 3C is a cross-section view schematically illustrating a third example of the acoustic wave resonator of the filter 10 according to the current example embodiment. In FIG. 3C, a bulk acoustic wave resonator is illustrated as an acoustic wave resonator of the filter 10. As illustrated in FIG. 3C, the bulk acoustic wave resonator includes, for example, a support substrate 65, a lower electrode 66, a piezoelectric layer 67, and an upper electrode 68. The bulk acoustic wave resonator is configured such that the support substrate 65, the lower electrode 66, the piezoelectric layer 67, and the upper electrode 68 are laminated in this order.

The support substrate 65 is a substrate to support the lower electrode 66, the piezoelectric layer 67, and the upper electrode 68 and is, for example, a silicon substrate. The support substrate 65 has a cavity in a region that is in contact with the lower electrode 66. Thus, the piezoelectric layer 67 can be made to vibrate freely.

The lower electrode 66 is provided on one surface of the support substrate 65. The upper electrode 68 is provided on one surface of the support substrate 65. The lower electrode 66 and the upper electrode 68 are made of, for example, Al including about 1% of Cu.

The piezoelectric layer 67 is between the lower electrode 66 and the upper electrode 68. For example, the piezoelectric layer 67 includes at least one of ZnO (zinc oxide), AlN (aluminum nitride), PZT (lead zirconate titanate), KN (potassium niobate), LN (lithium niobate), LT (lithium tantalate), quartz, and LiBO (lithium borate) as a main component.

The bulk acoustic wave resonator having the multilayer configuration described above generates resonance by applying electrical energy to between the lower electrode 66 and the upper electrode 68 to induce bulk acoustic waves inside the piezoelectric layer 67. The bulk acoustic waves generated by the bulk acoustic wave resonator propagate between the lower electrode 66 and the upper electrode 68 in a direction perpendicular to a film surface of the piezoelectric layer 67. That is, the bulk acoustic wave resonator is a resonator using bulk acoustic waves.

1.4 Resonance Characteristics of Series-Arm Resonator S3 Divided in Parallel

Next, resonance characteristics (impedance characteristics) of the series-arm resonator S3 that is divided in parallel into the series-arm resonators S31 and S32 will be described.

Figure 4:
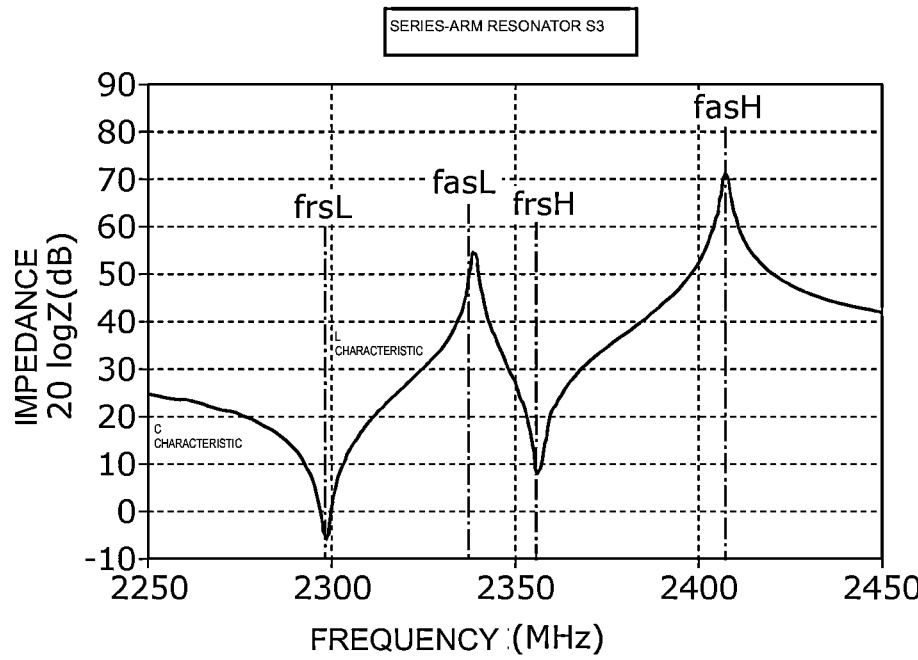
FIG. 4 is a graph indicating impedance characteristics of a resonator including a first series-arm resonator and a second series-arm resonator that are combined together in the second filter in an example embodiment of the present invention.

FIG. 4 is a graph indicating impedance characteristics of the series-arm resonator S3 including the series-arm resonators S31 and S32 that are combined together in the filter 10 (second filter) in the current example embodiment. The series-arm resonator S3 is a resonator including the series-arm resonators S31 and S32 that are obtained by parallel division and combined together. The series-arm resonator S31 has a resonant frequency fr1 and an anti-resonant frequency fa1, and the series-arm resonator S32 has a resonant frequency fr2 and an anti-resonant frequency fa2. The resonant frequency fr1 and the resonant frequency fr2 are different, and the anti-resonant frequency fa1 and the anti-resonant frequency fa2 are different.

As illustrated in FIG. 4, the resonance characteristics of the series-arm resonator S3 including the series-arm resonators S31 and S32 that are combined together include resonant frequencies frsL and frsH at which the impedance is minimum and anti-resonant frequencies fasL (first anti-resonant frequency) and fasH (second anti-resonant frequency) at which the impedance is maximum. The frequency relationship between the resonant frequencies frsL and frsH and the anti-resonant frequencies fasL and fasH is represented by frsL<fasL<frsH<fasH. The impedance of the series-arm resonator S3 is capacitive (C characteristic) in a frequency band lower than the resonant frequency frsL, and the impedance of the series-arm resonator S3 is inductive (L characteristic) in a frequency band higher than the resonant frequency frsL and lower than the anti-resonant frequency fasL (first anti-resonant frequency). Furthermore, the impedance of the series-arm resonator S3 is capacitive in a frequency band higher than the anti-resonant frequency fasL and lower than the resonant frequency frsH, the impedance of the series-arm resonator S3 is inductive in a frequency band higher than the resonant frequency frsH and lower than the anti-resonant frequency fasH (second anti-resonant frequency), and the impedance of the series-arm resonator S3 is capacitive in a frequency band higher than the anti-resonant frequency fasH. Furthermore, in the frequency band in which the impedance is inductive, the impedance is more inductive at a frequency closer to the anti-resonant frequency and is less inductive at a frequency closer to the resonant frequency.

1.5 Frequency Relationship of Series-Arm Resonator S3 and Parallel-Arm Resonator P2

Next, the frequency relationship of the series-arm resonator S3 and the parallel-arm resonator P2 will be described.

In FIGS. 5A and 5B and FIGS. 6A to 6E, a lower frequency end of the pass band of the filter 10 is represented by $f_{B1L}$, a higher frequency end of the pass band of the filter 10 is represented by $f_{B1H}$, a lower frequency end of the pass band of the filter 20 is represented by $f_{B2L}$, and a higher frequency end of the pass band of the filter 20 is represented by $f_{B2H}$.

Figures 5A, 5B:
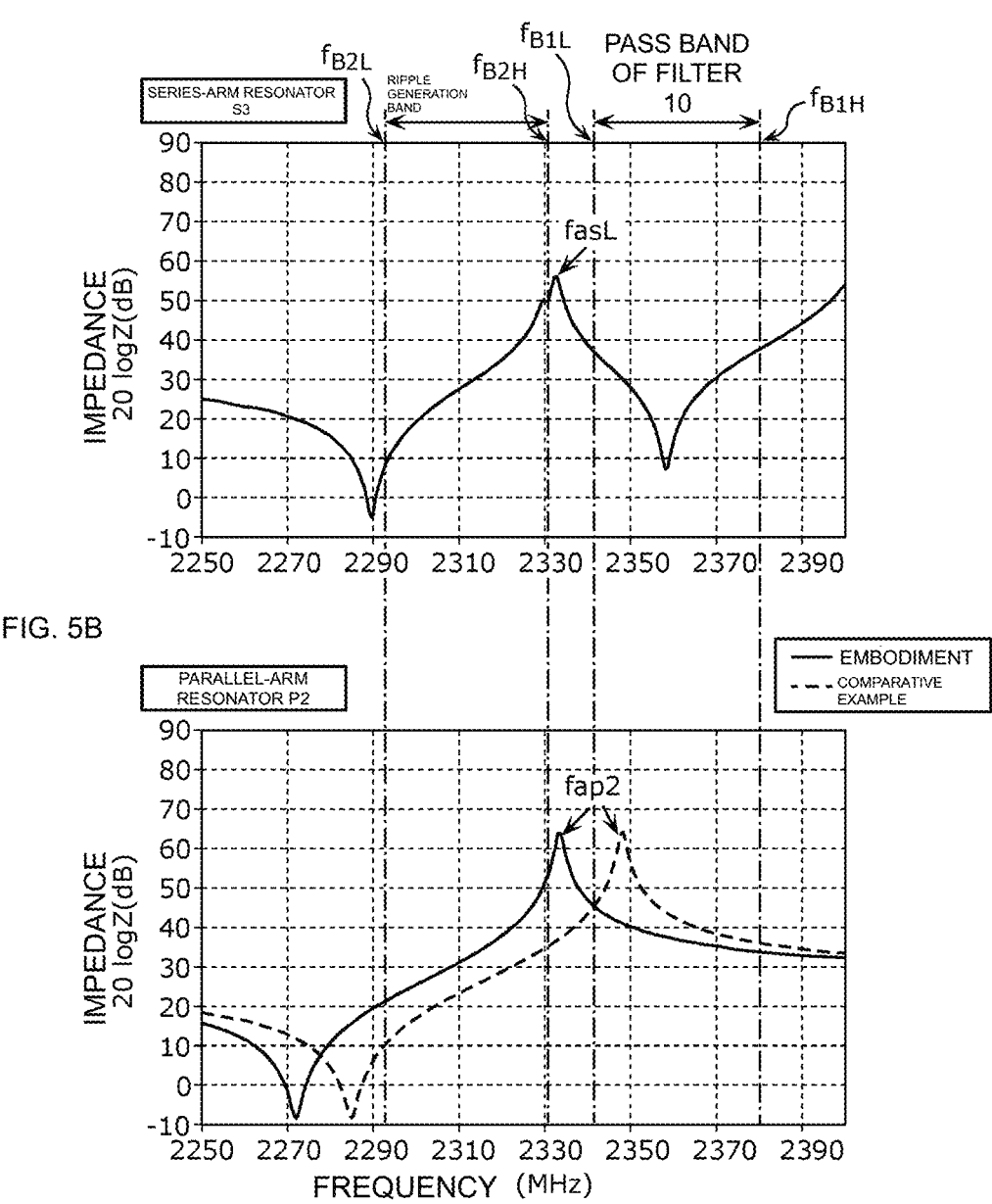
FIGS. 5A and 5B include graphs indicating the relationship between frequency and impedance of the resonator including the first series-arm resonator and the second series-arm resonator that are combined together and the relationship between frequency and impedance of a first parallel-arm resonator in the first filter in an example embodiment of the present invention.

FIG. 5A includes a graph indicating the relationship between frequency and impedance of the series-arm resonator S3 in the filter 10 (second filter) in an example embodiment and a graph (b) indicating the relationship between frequency and impedance of the parallel-arm resonator P2 in an example embodiment and in a Comparative Example.

A multiplexer according to a Comparative Example is different from the multiplexer 1 according to the current example embodiment only in that the anti-resonant frequency fap2 of the parallel-arm resonator P2 in the filter 10 is within the pass band of the filter 10. In FIG. 5B, the impedance of the parallel-arm resonator P2 in an example embodiment is represented by a wave form indicated by a solid line, and the impedance of the parallel-arm resonator P2 in a Comparative Example is represented by a wave form indicated by a broken line.

As illustrated in FIG. 5A, in the multiplexer according to the current example embodiment and the multiplexer according to a Comparative Example, the anti-resonant frequency fasL of the series-arm resonator S3 is located lower than the pass band of the filter 10. Furthermore, although not illustrated in the drawing, the anti-resonant frequency fasH of the series-arm resonator S3 is located higher than the pass band of the filter 10.

In the case where a multiplexer is configured such that the filter 10 is used as a filter on a higher frequency side, due to the fact that impedance in a lower frequency band that is lower than the anti-resonant frequency fasL is inductive, the amount of variations in the impedance in the lower frequency band of the filter 10 increases (turn of impedance in the lower frequency band on a Smith chart increases). Thus, in the filter 20 on a lower frequency side whose pass band overlaps the lower frequency band, an unnecessary response occurs near the pass band of the filter 20 (ripple generation band indicated in FIG. 5A), and the unnecessary response may appear as ripple in the pass band. A ripple generation band in an example embodiment and a Comparative Example is defined as a frequency band from the lower frequency end $f_{B2L}$ of the pass band of the filter 20 to the anti-resonant frequency fasL, as illustrated in FIG. 5A.

In contrast, in the multiplexer 1 according to the current example embodiment, as illustrated in FIG. 5B, the anti-resonant frequency fap2 of the parallel-arm resonator P2, which is connected directly to the common terminal 100 side of the series-arm resonator S3, is set to be lower than the lower frequency end $f_{B1L}$ of the pass band of the filter 10 (wave form indicated by a solid line in FIG. 5B). In the frequency region from the resonant frequency to the anti-resonant frequency fap2 of the parallel-arm resonator P2, the impedance of the parallel-arm resonator P2 is inductive. Furthermore, in the frequency band in which the impedance is inductive, the impedance is more inductive at a frequency closer to the anti-resonant frequency fap2 and is less inductive at a frequency closer to the resonant frequency.

Accordingly, in the filter 10, the frequency region in which the impedance of the series-arm resonator S3 is inductive and the frequency region in which the impedance of the parallel-arm resonator P2 is inductive can be made to overlap. Thus, in the filter 10, the amount of variations in the impedance in the lower frequency band (ripple generation band mentioned above) can be reduced (turn of the impedance in the lower frequency band on the Smith chart can be reduced). Therefore, since an unnecessary response generated near the pass band of the filter 20 can be reduced or prevented in the filter 20 on the lower frequency side whose pass band overlaps the lower frequency band, ripple inside the pass band of the filter 20 can be reduced or prevented. Thus, the multiplexer 1 in which insertion loss in the pass band of the filter 20 connected to the common terminal 100 is reduced can be provided.

In a (conventional) multiplexer according to a Comparative Example, the anti-resonant frequency fap2 of the parallel-arm resonator P2 of the filter 10 is located within the pass band of the filter 10. Thus, it is difficult to make a frequency region in which the impedance of the parallel-arm resonator P2 is inductive (highly inductive) overlap the pass band of the filter 20.

In the multiplexer 1 according to the current example embodiment, it is desirable that the anti-resonant frequency fap2 of the parallel-arm resonator P2 be equal to or higher than the anti-resonant frequency fasL and lower than the lower frequency end $f_{B1L}$ of the pass band of the filter 10.

Accordingly, in the filter 10, the frequency region in which the impedance of the series-arm resonator S3 is inductive and the frequency region in which the impedance of the parallel-arm resonator P2 is inductive can be made to overlap accurately.

Furthermore, in the multiplexer 1 according to the current example embodiment, it is further desirable that the anti-resonant frequency fap2 of the parallel-arm resonator P2 match the anti-resonant frequency fasL.

Accordingly, in the filter 10, the frequency region in which the impedance of the series-arm resonator S3 is inductive and the frequency region in which the impedance of the parallel-arm resonator P2 is highly inductive can be made to overlap.

In the current example embodiment, the state in which the anti-resonant frequency fap2 matches the anti-resonant frequency fasL not only represents the state in which the two anti-resonant frequencies completely match but also includes the state in which the anti-resonant frequency fap2 is within (about 100±0.1)% of the anti-resonant frequency fasL.

1.6 Impedance State of Filter 10

Next, impedance when seen from each node of the filter 10 included in the multiplexer according to the current example embodiment will be described, by comparison with the multiplexer according to a Comparative Example, with reference to FIGS. 6A to 6E.

Figure 6A:
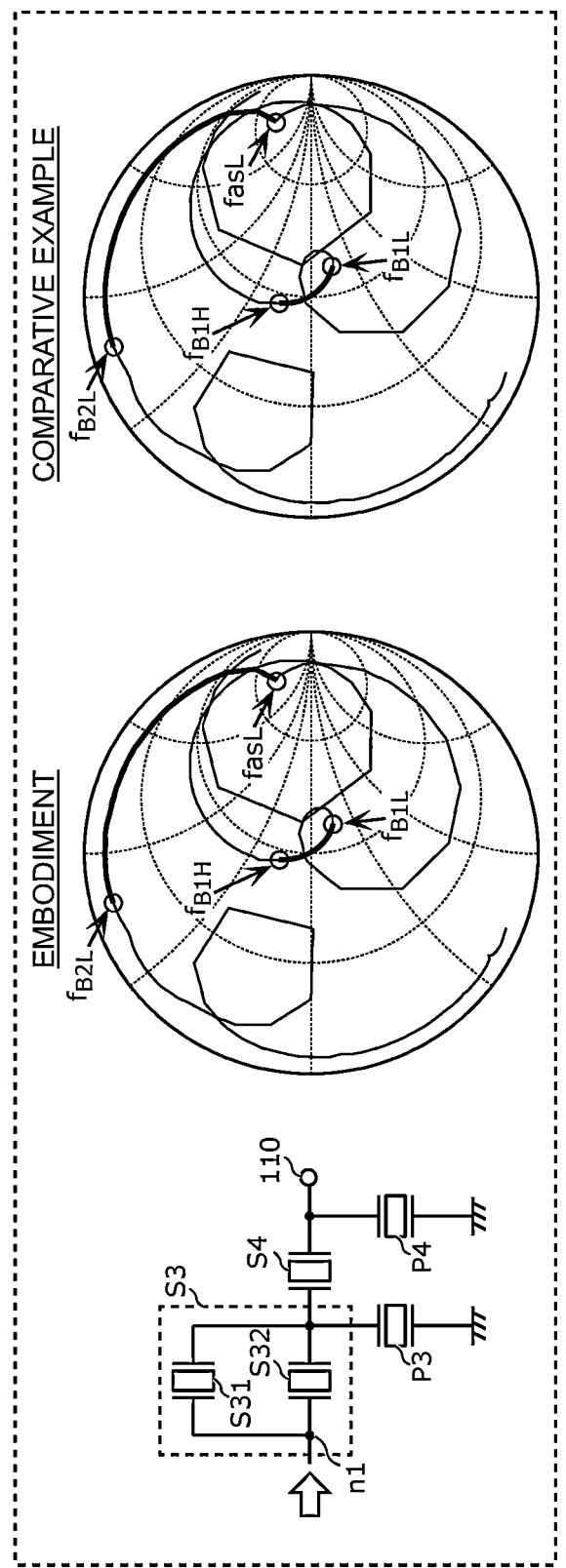
FIG. 6A includes Smith charts indicating impedance in the cases where a terminal 110 side is seen from a connection point n1 of the second filter in an example embodiment of the present invention and in a Comparative Example.

FIG. 6A is a Smith chart indicating impedance in the cases where the output terminal 110 side is seen from the connection point n1 of the filter 10 (second filter) in an example embodiment and in a Comparative Example. In FIG. 6A, impedance in the case where a circuit in which the series-arm resonators S3 and S4 and the parallel-arm resonators P3 and P4 are connected, while the filter 20, the series-arm resonators S1 and S2, and the parallel-arm resonators P1 and P2 not being connected, is seen from the connection point n1, is illustrated.

As illustrated in FIG. 6A, in the filter 10 in the current example embodiment, a band from the lower frequency end $f_{B2L}$ of the pass band of the filter 20 to the anti-resonant frequency fasL (hereinafter, referred to as a ripple generation band) is located in an inductive region on the Smith chart.

In contrast, in the filter 10 in a Comparative Example, the ripple generation band is located in an inductive region on the Smith chart, which is similar to the characteristics of the filter 10 in the current example embodiment.

Figure 6B:
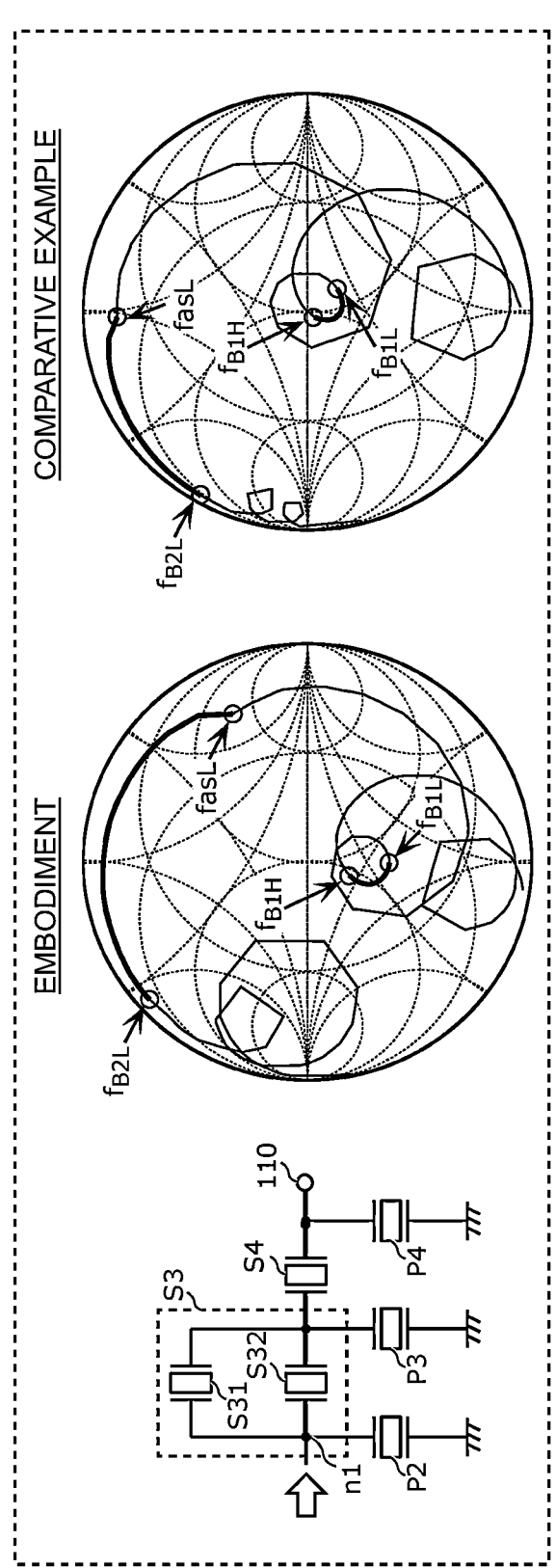
FIG. 6B includes Smith charts indicating impedance in the cases where the terminal 110 side is seen from the connection point n1 of the second filter in an example embodiment of the present invention and in a Comparative Example.

FIG. 6B is a Smith chart indicating impedance in the cases where the output terminal 110 side is seen from the connection point n1 of the filter 10 (second filter) in an example embodiment and in a Comparative Example. In FIG. 6B, impedance in the case where a circuit in which the series-arm resonators S3 and S4 and the parallel-arm resonators P2, P3, and P4 are connected, while the filter 20, the series-arm resonators S1 and S2, and the parallel-arm resonator P1 not being connected, is seen from the connection point n1, is illustrated.

In both the current example embodiment and a Comparative Example, the circuit illustrated in FIG. 6B is different from the circuit illustrated in FIG. 6A in that the parallel-arm resonator P2 is connected and an inductive impedance of the parallel-arm resonator P2 is thus added in parallel in the ripple generation band of the filter 10. Thus, the impedance in the ripple generation band of the filter 10 moves in a counter-clockwise direction along a constant conductance circle on the Smith chart.

However, in the current example embodiment, since the anti-resonant frequency fasL is much closer to the anti-resonant frequency fap2 of the parallel-arm resonator P2, a high inductive impedance is added in parallel near the anti-resonant frequency fasL in the ripple generation band. Thus, the amount of shift of impedance is small in the Smith chart.

In contrast, in a Comparative Example, since the anti-resonant frequency fasL overlaps a frequency lower than the anti-resonant frequency fap2 of the parallel-arm resonator P2, a low inductive impedance is added in parallel near the anti-resonant frequency fasL in the ripple generation band. Thus, the amount of shift of impedance is large in the Smith chart.

Furthermore, in an example embodiment and a Comparative Example, impedance with a similar level of inductive characteristic is added in parallel to the lower frequency end $f_{B2L}$ in the ripple generation band. Thus, in an example embodiment and a Comparative Example, the amount of shift of impedance at the lower frequency end $f_{B2L}$ is substantially the same in the Smith chart.

That is, in FIG. 6B, an impedance deviation in the ripple generation band (difference in impedance from the lower frequency end $f_{B2L}$ to the anti-resonant frequency fasL) in an example embodiment is greater than an impedance deviation in the ripple generation band in a Comparative Example.

Figure 6C:
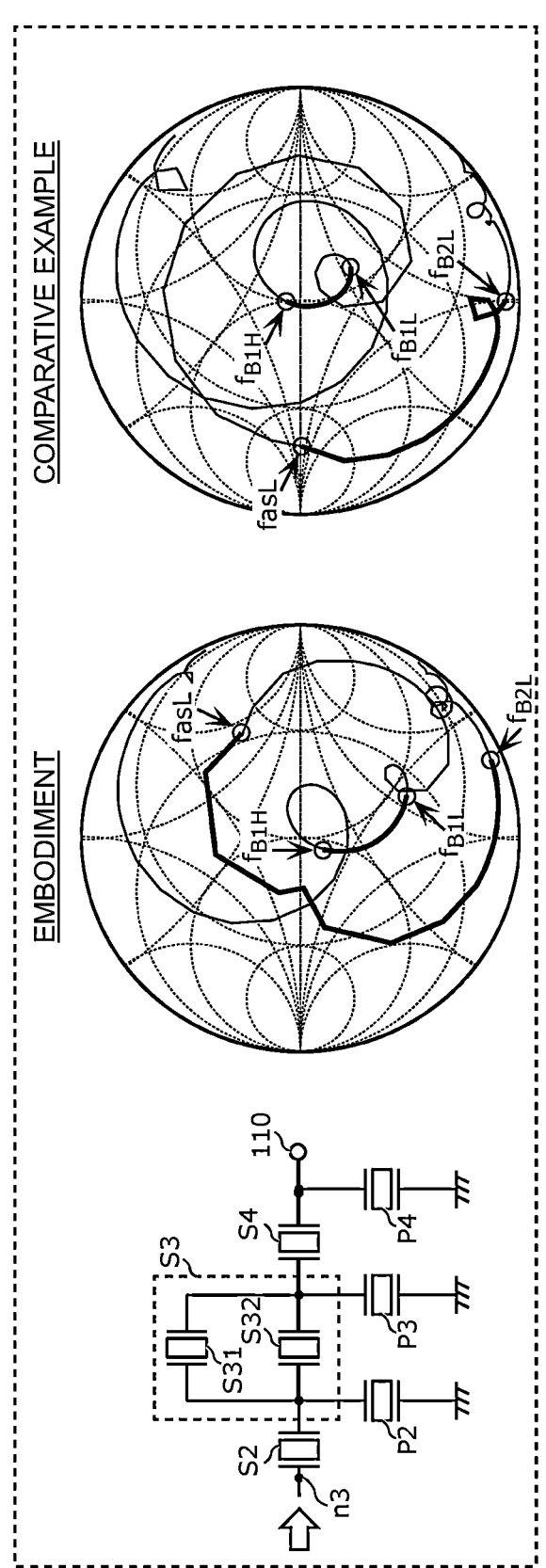
FIG. 6C includes Smith charts indicating impedance in the cases where the terminal 110 side is seen from a connection point n3 of the second filter in an example embodiment of the present invention and in a Comparative Example.

FIG. 6C is a Smith chart indicating impedance in the cases where the output terminal 110 side is seen from a connection point n3 of the filter 10 (second filter) in an example embodiment and in a Comparative Example. In FIG. 6C, impedance in the case where a circuit in which the series-arm resonators S2, S3, and S4 and the parallel-arm resonators P2, P3, and P4 are connected, while the filter 20, the series-arm resonator S1, and the parallel-arm resonator P1 not being connected, is seen from the connection point n3, is illustrated.

In both the current example embodiment and a Comparative Example, the circuit illustrated in FIG. 6C is different from the circuit illustrated in FIG. 6B in that the series-arm resonator S2 is connected and a capacitive impedance of the series-arm resonator S2 is thus added in series in the ripple generation band of the filter 10. Thus, the impedance in the ripple generation band of the filter 10 moves in the counter-clockwise direction along a constant resistance circle.

In an example embodiment and a Comparative Example, an impedance with a similar level of capacitive character-istic is added in series in the ripple generation band. Thus, in an example embodiment and a Comparative Example, in the Smith charts, the amount of shift of the ripple generation band is substantially the same.

That is, in FIG. 6C, the relationship of the impedance deviation in FIG. 6B is maintained, and an impedance deviation in the ripple generation band in an example embodiment is greater than an impedance deviation in the ripple generation band in a Comparative Example. Further-more, in the Smith charts, the frequency range of a turn of impedance including impedance of the ripple generation band in a Comparative Example is wider than that in the example embodiment.

Figure 6D:
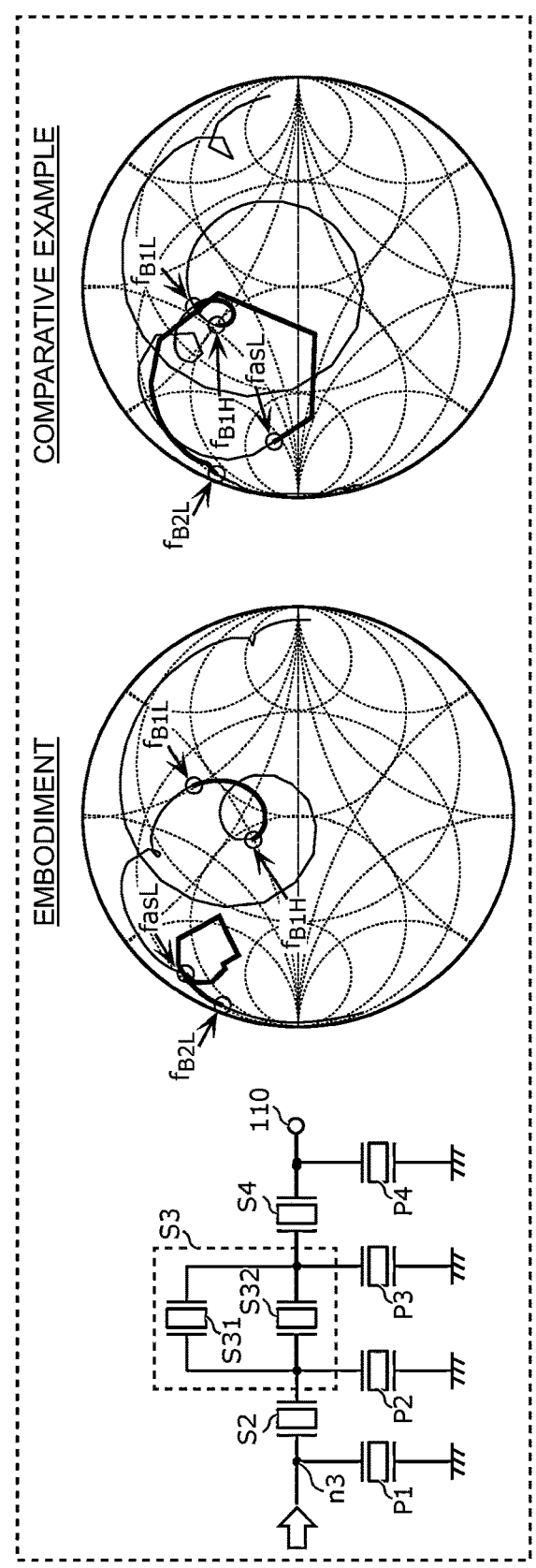
FIG. 6D includes Smith charts indicating impedance in the cases where the terminal 110 side is seen from the connection point n3 of the second filter in an example embodiment of the present invention and in a Comparative Example.

FIG. 6D is a Smith chart indicating impedance in the cases where the output terminal 110 side is seen from the connection point n3 of the filter 10 (second filter) in an example embodiment and in a Comparative Example. In FIG. 6D, impedance in the case where a circuit in which the series-arm resonators S2, S3, and S4 and the parallel-arm resonators P1, P2, P3, and P4 are connected, while the filter 20 and the series-arm resonators S1 not being connected, is seen from the connection point n3, is illustrated.

In both the current example embodiment and a Comparative Example, the circuit illustrated in FIG. 6D is different from the circuit illustrated in FIG. 6C in that the parallel-arm resonator P1 is connected and an inductive impedance of the parallel-arm resonator P1 is thus added in parallel in the ripple generation band of the filter 10. Thus, the impedance in the ripple generation band of the filter 10 moves in the counter-clockwise direction along a constant conductance circle on the Smith chart.

In the current example embodiment, the anti-resonant frequency fasL in FIG. 6C is located on a large constant conductance circle. Thus, when the inductive impedance of the parallel-arm resonator P1 is added in parallel, the imped-ance moves largely in the counter-clockwise direction along the large constant conductance. Furthermore, the lower frequency end $f_{B2L}$ in FIG. 6C is also located on a large constant conductance circle. Thus, when the inductive impedance of the parallel-arm resonator P1 is added in parallel, the impedance moves largely in the counter-clock-wise direction along the large constant conductance.

In contrast, in a Comparative Example, the anti-resonant frequency fasL in FIG. 6C is located on a small constant conductance circle. Thus, when the inductive impedance of the parallel-arm resonator P1 is added in parallel, the imped-ance moves in the counter-clockwise direction along the small constant conductance. Therefore, the anti-resonant frequency fasL does not move largely. Furthermore, the lower frequency end fB2L in FIG. 6C is located on a large constant conductance circle. Thus, when the inductive impedance of the parallel-arm resonator P1 is added in parallel, the impedance moves largely in the counter-clock-wise direction along the large constant conductance.

As described above, in an example embodiment and a Comparative Example, the amount of impedance shift is different between the anti-resonant frequency fasL and the lower frequency end $f_{B2L}$ configuring both ends of the ripple generation band of the filter 10. As a result, the degree of convergence of the impedance in the ripple generation band in an example embodiment is higher than that in a Com-parative Example (the amount of change in the impedance in an example embodiment is smaller than that in a Compara-tive Example).

This is because, as described above with reference to FIG. 6C, in the Smith charts, the frequency range of a turn of impedance including the impedance in the ripple generation band in a Comparative Example is wider than that in the current example embodiment. That is, in the Smith charts, the degree of convergence of the impedance in the ripple generation band when an inductive impedance is added in parallel in the case where the frequency range of a turn of impedance is narrow is higher (the amount of change in impedance is smaller) than that in the case where the frequency range of a turn of impedance is wide.

Figure 6E:
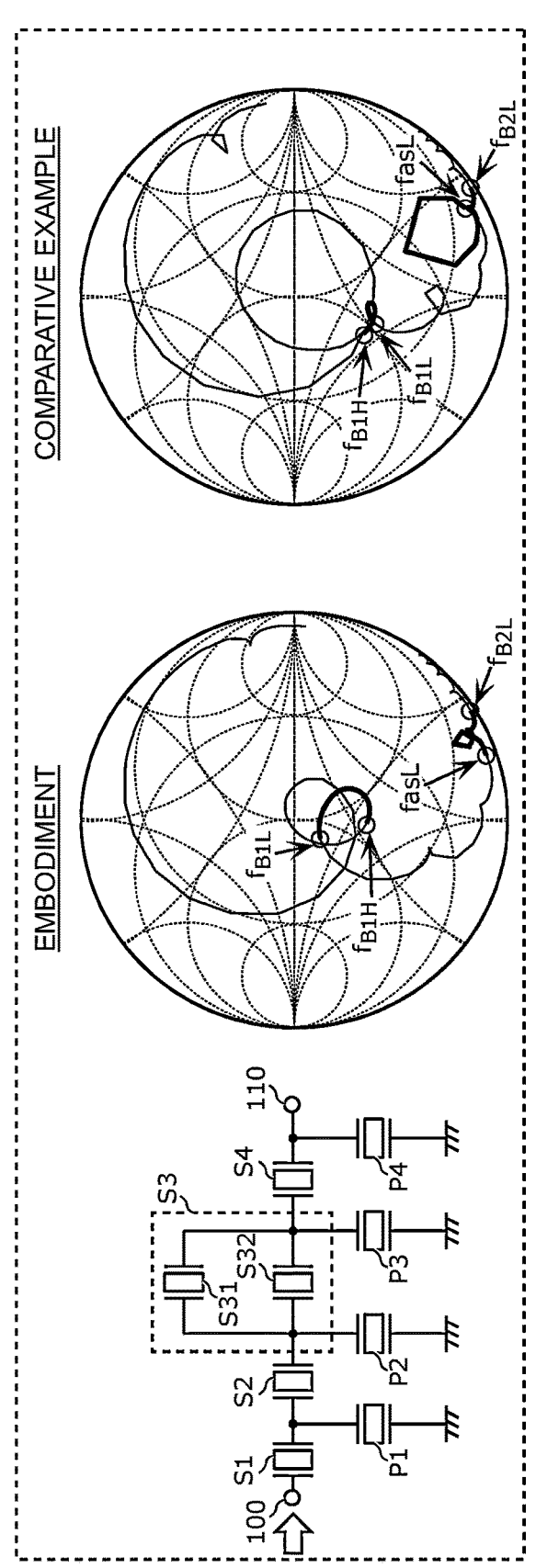
FIG. 6E includes Smith charts indicating impedance in the cases where the terminal 110 side is seen from a common terminal 100 of the second filter in an example embodiment of the present invention and in a Comparative Example.

FIG. 6E is a Smith chart indicating impedance in the cases where the output terminal 110 side is seen from the common terminal 100 of the filter 10 (second filter) in an example embodiment and in a Comparative Example. In FIG. 6E, impedance in the case where a circuit in which the series-arm resonators S1, S2, S3, and S4 and the parallel-arm resonators P1, P2, P3, and P4 are connected, while the filter 20 not being connected, is seen from the common terminal 100, is illustrated.

In both the current example embodiment and a Compara-tive Example, the circuit illustrated in FIG. 6E is different from the circuit illustrated in FIG. 6D in that the series-arm resonator S1 is connected and a capacitive impedance of the series-arm resonator S1 is thus added in series in the ripple generation band of the filter 10. Thus, impedance in the ripple generation band of the filter 10 moves in the counter-clockwise direction along a constant resistance circle.

In an example embodiment and a Comparative Example, an impedance with a similar level of capacitive character-istic is added in series in the ripple generation band. Thus, in an example embodiment and a Comparative Example, in the Smith charts, the amount of shift of the ripple generation band is substantially the same, and the ripple generation band moves from an inductive region to a capacitive region both in an example embodiment and a Comparative Example.

That is, in FIG. 6E, the relationship of the degree of impedance convergence in FIG. 6D is maintained, and the degree of impedance convergence in the ripple generation band in an example embodiment is higher than the degree of impedance convergence in the ripple generation band in a Comparative Example. In other words, in the Smith charts, the turn of impedance in the ripple generation band in an example embodiment is smaller than the turn of impedance in the ripple generation band in a Comparative Example. Thus, in the multiplexer 1 according to the current example embodiment, in the filter 20 on the lower frequency side whose pass band overlaps the ripple generation band, an unnecessary response generated near the pass band of the filter 20 is reduced or prevented. Therefore, ripple in the pass band of the filter 20 can be reduced or prevented.

In the multiplexer 1 according to the current example embodiment, it is desirable that the capacitance of the series-arm resonator S2 of the filter 10 be smallest among the capacitances of the series-arm resonators disposed on the portion of the series arm path that connects the common terminal 100 to the series-arm resonator S3.

Accordingly, by reducing the capacitance of the series-arm resonator S2 that is connected, on the common terminal

100 side, closest to the series-arm resonator S3 and the parallel-arm resonator P2, the ripple generation band can be moved more towards an open side (higher impedance side) on the Smith chart.

Furthermore, it is desirable that the resonant frequency of the parallel-arm resonator P2 be lowest among the resonant frequencies of the plurality of parallel-arm resonators configuring the filter 10.

Accordingly, since the inductive region in which the impedance of the parallel-arm resonator P2 is high can be made to overlap the ripple generation band, an impedance deviation in the ripple generation band can be increased.

Furthermore, it is desirable that the electrode finger pitch of the IDT electrode of the parallel-arm resonator P2 be largest among the electrode finger pitches of the IDT electrodes of the plurality of parallel-arm resonators configuring the filter 10.

Accordingly, since the inductive region in which the impedance of the parallel-arm resonator P2 is high can be made to overlap the ripple generation band, an impedance deviation in the ripple generation band can be increased.

Furthermore, the anti-resonant frequency of at least one of the plurality of parallel-arm resonators other than the parallel-arm resonator P2 is within the pass band of the filter 10.

Accordingly, insertion loss in the pass band of the filter 10 can be reduced.

Furthermore, in the filter 10, it is desirable that a resonator including two series-arm resonators that are connected in parallel be not disposed on the portion of the series arm path between the common terminal 100 and the series-arm resonator S3.

Accordingly, since a resonator that causes an unnecessary response generated near the pass band of the filter 20 is not connected closer to the common terminal 100 than the series-arm resonator S3 and the parallel-arm resonator P2 are, generation of the unnecessary response can be reduced or prevented.

1.7 Bandpass Characteristics of Multiplexer 1

Figure 7A:
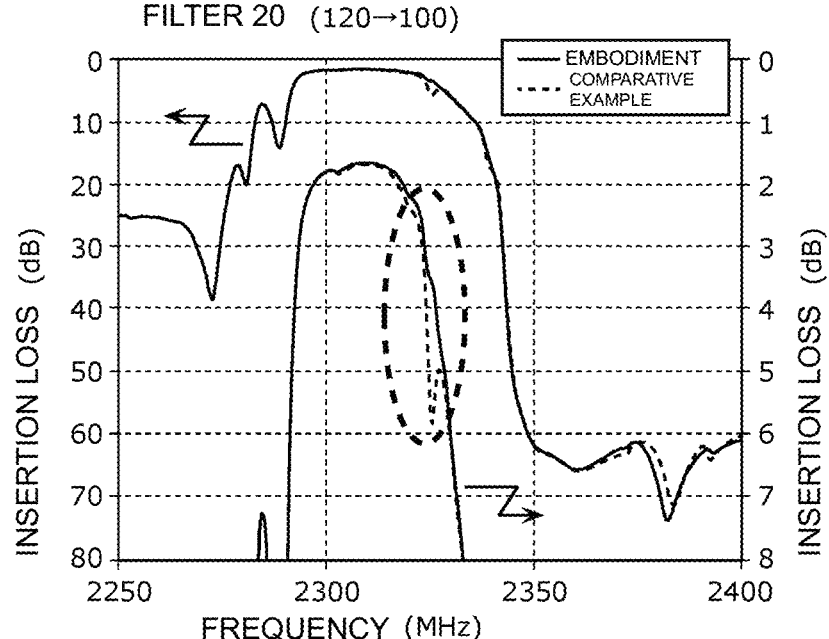
FIG. 7A is a graph indicating bandpass characteristics of the first filter in an example embodiment of the present invention and in a Comparative Example.
Figure 7B:
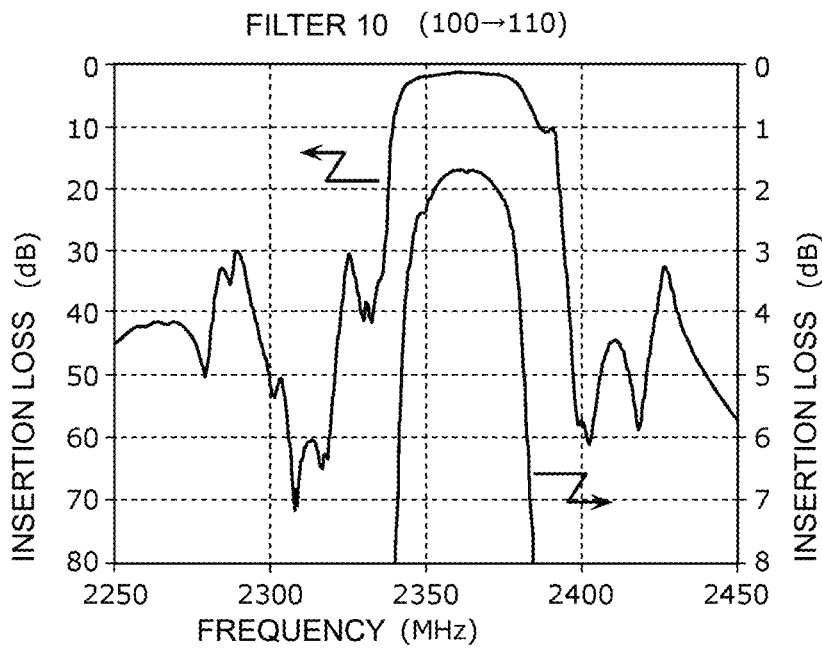
FIG. 7B is a graph indicating bandpass characteristics of the second filter in an example embodiment of the present invention.

FIG. 7A is a graph indicating bandpass characteristics of the filter 20 in an example embodiment and in a Comparative Example. FIG. 7B is a graph indicating bandpass characteristics of the filter 10 in the current example embodiment.

In FIG. 7A, bandpass characteristics of a portion from the input terminal 120 to the common terminal 100 of the multiplexer 1 according to the current example embodiment (wave form indicated by a solid line) and bandpass characteristics of a portion from the input terminal 120 to the common terminal 100 of the multiplexer according to a Comparative Example (wave form indicated by a broken line) are illustrated. In FIG. 7B, bandpass characteristics of a portion from the common terminal 100 to the input terminal 110 of the multiplexer 1 according to the current example embodiment are illustrated. Bandpass characteristics of the portion from the common terminal 100 to the input terminal 110 of the multiplexer according to a Comparative Example are represented by substantially the same wave form as the wave form representing the bandpass characteristics of the multiplexer 1 according to the current example embodiment illustrated in FIG. 7B, and the bandpass characteristics in a Comparative Example are not indicated in FIG. 7B.

As illustrated in FIG. 7A, ripple is generated in a higher frequency region of the pass band in the bandpass characteristics of the filter 20 of the multiplexer according to a Comparative Example, whereas no ripple is generated in the higher frequency region of the pass band in the bandpass characteristics of the filter 20 of the multiplexer 1 according to the current example embodiment. Thus, in the multiplexer 1 according to the current example embodiment, insertion loss in the pass band of the filter 20 can be reduced.

This is because, in the multiplexer 1 according to the current example embodiment, an unnecessary response generated near the pass band of the filter 20, which is on the lower frequency side whose pass band overlaps the ripple generation bend, is reduced or prevented.

2. Advantageous Effects and Others

As described above, the multiplexer 1 according to the current example embodiment includes the filter 20 that has a first pass band, and the filter 10 that has a second pass band whose frequencies are higher than frequencies of the first pass band. A first end of the filter 10 and a first end of the filter 20 are connected. The filter 10 includes a plurality of acoustic wave resonators. The plurality of acoustic wave resonators include the series-arm resonator S31 that is disposed on a series arm path connecting the first end to a second end of the filter 10, the series-arm resonator S32 that is connected in parallel with the series-arm resonator S31, and the parallel-arm resonator P2 that is disposed on a parallel arm path connecting the connection point n1 between the series-arm resonator S31 and the series-arm resonator S32 to the ground. The series-arm resonator S3 including the series-arm resonator S31 and the series-arm resonator S32 that are combined together has the anti-resonant frequency fasL that is lower than the second pass band and the anti-resonant frequency fasH that is higher than the second pass band. The parallel-arm resonator P2 has the anti-resonant frequency fap2. The anti-resonant frequency fap2 is lower than a lower frequency end $f_{B1L}$ of the second pass band.

Accordingly, in the filter 10, a frequency region in which impedance of the series-arm resonator S3 is inductive and a frequency region in which impedance of the parallel-arm resonator P2 is inductive can be made to overlap. Thus, in the filter 10, the amount of variations in the impedance in a band (referred to as a ripple generation band) lower than the second pass band can be reduced (the turn of the impedance in the ripple generation band in a Smith chart can be reduced). Therefore, in the filter 20 on a lower frequency side whose pass band overlaps the ripple generation band, an unnecessary response generated near the pass band of the filter 20 can be reduced or prevented, and ripple in the pass band can be reduced or prevented. Thus, the multiplexer 1 in which insertion loss in the pass band of the filter 20 connected to the common terminal 100 is reduced can be provided.

Furthermore, for example, in the multiplexer 1, the anti-resonant frequency fap2 is equal to or higher than the anti-resonant frequency fasL and lower than the lower frequency end $f_{B1L}$ of the second pass band.

Accordingly, in the filter 10, the frequency region in which the impedance of the series-arm resonator S3 is inductive and the frequency region in which the impedance of the parallel-arm resonator P2 is inductive can be made to overlap accurately.

Furthermore, for example, in the multiplexer 1, the anti-resonant frequency fap2 matches the anti-resonant frequency fasL.

Accordingly, in the filter 10, the frequency region in which the impedance of the series-arm resonator S3 is inductive and the frequency region in which the impedance of the parallel-arm resonator P2 is highly inductive can be made to overlap.

Furthermore, for example, in the multiplexer 1, the filter 10 further includes the series-arm resonator S2 that is disposed on a portion of the series arm path between the first end of the filter 10 and the series-arm resonator S3.

Furthermore, for example, in the multiplexer 1, the filter 10 includes a plurality of series-arm resonators that are disposed on the portion of the series arm path between the first end and the series-arm resonator S3. The series-arm resonator S2 is connected closest to the series-arm resonator S3 among the plurality of series-arm resonators.

Furthermore, for example, in the multiplexer 1, the capacitance of the series-arm resonator S2 is smallest among capacitances of the plurality of series-arm resonators.

Accordingly, the ripple generation band can be moved more towards an open side (higher impedance side) on a Smith chart.

Furthermore, for example, in the multiplexer 1, the filter 10 includes a plurality of parallel-arm resonators that are connected between the series arm path and the ground. The resonant frequency of the parallel-arm resonator P2 is lowest among resonant frequencies of the plurality of parallel-arm resonators.

Accordingly, an inductive region in which the impedance of the parallel-arm resonator P2 is high can be made to overlap the ripple generation band. Thus, an impedance deviation in the ripple generation band can be increased.

Furthermore, for example, in the multiplexer 1, the anti-resonant frequency of at least one of the plurality of parallel-arm resonators other than the parallel-arm resonator P2 is within the second pass band.

Accordingly, insertion loss in the pass band of the filter 10 can be reduced.

Furthermore, for example, in the multiplexer 1, each of the plurality of acoustic wave resonators is a surface acoustic wave resonator including an IDT electrode. The filter 10 includes a plurality of parallel-arm resonators that are connected between the series arm path and the ground. The electrode finger pitch of the IDT electrode of the parallel-arm resonator P2 is largest among electrode finger pitches of IDT electrodes of the plurality of parallel-arm resonators.

Accordingly, the inductive region in which the impedance of the parallel-arm resonator P2 is high can be made to overlap the ripple generation band. Thus, an impedance deviation in the ripple generation band can be increased.

Furthermore, for example, in the filter 10 of the multiplexer 1, two series-arm resonators that are connected in parallel are not disposed on the portion of the series arm path between the first end and the series-arm resonator S3.

Accordingly, a resonator that causes an unnecessary response generated near the pass band of the filter 20 is not connected closer to the common terminal 100 than the series-arm resonator S3 and the parallel-arm resonator P2 are. Thus, generation of the unnecessary response can be reduced or prevented.

Other Example Embodiments

A multiplexer according to an example embodiment the present invention has been described above. However, the present invention is not limited to the example embodiment described above. Modifications obtained by making various changes to the example embodiment described above without departing from the spirit of the present invention and various types of equipment including multiplexers according to example embodiments the present invention are also included in the present invention.

Furthermore, for example, matching elements such as an inductor and a capacitor and a switch circuit may be connected between component elements in the multiplexer according to the current example embodiment described above.

Resonant frequencies and anti-resonant frequencies illustrated in an example embodiment described above can be derived by, for example, making an RF probe in contact with two input/output electrodes of an acoustic wave resonator and measuring reflection characteristics.

Example embodiments of the present invention can be widely used, as low-loss multiplexers applicable to multi-band, multi-mode frequency standards, for communication equipment such as mobile phones.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:

a first filter with a first pass band; and a second filter with a second pass band having higher frequencies than frequencies of the first pass band; wherein a first end of the first filter and a first end of the second filter are connected;

the second filter includes a plurality of acoustic wave resonators;

the plurality of acoustic wave resonators include:

a first series-arm resonator on a series arm path connecting the first end to a second end of the second filter;

a second series-arm resonator connected in parallel with the first series-arm resonator; and a first parallel-arm resonator on a parallel arm path connecting a connection point adjacent to the first end among connection points between the first series-arm resonator and the second series-arm resonator to a ground;

a resonator including the first series-arm resonator and the second series-arm resonator that are combined together has a first anti-resonant frequency that is lower than the second pass band and a second anti-resonant frequency that is higher than the second pass band;

the first parallel-arm resonator has a third anti-resonant frequency; and the third anti-resonant frequency is lower than a lower frequency end of the second pass band.

2. The multiplexer according to claim 1, wherein the third anti-resonant frequency is equal to or higher than the first anti-resonant frequency and lower than the lower frequency end of the second pass band.

3. The multiplexer according to claim 1, wherein the third anti-resonant frequency matches the first anti-resonant frequency.

4. The multiplexer according to claim 1, wherein the second filter further includes a third series-arm resonator on a portion of the series arm path between the first end, and the first series-arm resonator and the second series-arm resonator.

5. The multiplexer according to claim 4, wherein the second filter includes a plurality of series-arm resonators on a portion of the series arm path between the first end, and the first series-arm resonator and the second series-arm resonator; and the third series-arm resonator is connected closest to the first series-arm resonator and the second series-arm resonator among the plurality of series-arm resonators.

6. The multiplexer according to claim 5, wherein a capacitance of the third series-arm resonator is smallest among capacitances of the plurality of series-arm resonators.

7. The multiplexer according to claim 1, wherein
the second filter includes a plurality of parallel-arm resonators that are connected between the series arm path and the ground; and
a resonant frequency of the first parallel-arm resonator is lowest among resonant frequencies of the plurality of parallel-arm resonators.

8. The multiplexer according to claim 7, wherein an anti-resonant frequency of at least one of the plurality of parallel-arm resonators other than the first parallel-arm resonator is within the second pass band.

9. The multiplexer according to claim 1, wherein
each of the plurality of acoustic wave resonators is a surface acoustic wave resonator including an interdigital transducer (IDT) electrode;
the second filter includes a plurality of parallel-arm resonators that are connected between the series arm path and the ground; and
an electrode finger pitch of the IDT electrode of the first parallel-arm resonator is largest among electrode finger pitches of IDT electrodes of the plurality of parallel-arm resonators.

10. The multiplexer according to claim 1, wherein in the second filter, two series-arm resonators that are connected in parallel are not on a portion of the series arm path between the first end, and the first series-arm resonator and the second series-arm resonator.

11. The multiplexer according to claim 1, wherein the first filter is an acoustic wave filter including an acoustic wave resonator or an LC filter including an inductor and a capacitor.

12. The multiplexer according to claim 1, wherein the first pass band includes an uplink-operating band of band A and the second pass band includes a downlink operating band of band A.

13. The multiplexer according to claim 1, wherein band A is LTE Band 30.

14. The multiplexer according to claim 1, wherein the first pass band includes band B and the second pass band includes band C.

15. The multiplexer according to claim 1, further comprising an impedance matching circuit connected to either of the parallel arm path or the series arm path.

16. The multiplexer according to claim 1, wherein the second filter is a ladder band pass filter.

17. The multiplexer according to claim 1, wherein at least one of the plurality of acoustic wave resonators is a longitudinally coupled acoustic wave resonator.

18. The multiplexer according to claim 1, wherein at least one of the plurality of acoustic wave resonators includes a piezoelectric substrate and interdigital electrodes on the piezoelectric substrate.

19. The multiplexer according to claim 18, wherein the interdigital electrode includes a main electrode layer and a close-contact layer.

20. The multiplexer according to claim 18, wherein the at least one of the plurality of acoustic wave resonators includes a protection layer covering the interdigital electrode.

\* \* \* \* \*